United States Patent
Hayashida et al.

(10) Patent No.: US 9,260,033 B2
(45) Date of Patent: Feb. 16, 2016

(54) POWER SUPPLY DEVICE AND VEHICLE INCLUDING THE SAME

(75) Inventors: Atsushi Hayashida, Hyogo (JP); Shinya Inui, Hyogo (JP)

(73) Assignee: SANYO ELECTRIC CO., LTD., Osaka (JP)

(*) Notice: Subject to any disclaimer, the term of this patent is extended or adjusted under 35 U.S.C. 154(b) by 127 days.

(21) Appl. No.: 14/131,741

(22) PCT Filed: Jul. 10, 2012

(86) PCT No.: PCT/JP2012/067580
§ 371 (c)(1),
(2), (4) Date: Jan. 9, 2014

(87) PCT Pub. No.: WO2013/008814
PCT Pub. Date: Jan. 17, 2013

(65) Prior Publication Data
US 2014/0139149 A1    May 22, 2014

(30) Foreign Application Priority Data

Jul. 13, 2011   (JP) ................................ 2011-155164

(51) Int. Cl.
*H02J 7/04*     (2006.01)
*B60L 11/18*    (2006.01)
(Continued)

(52) U.S. Cl.
CPC ......... *B60L 11/1862* (2013.01); *G01R 31/3606* (2013.01); *G01R 31/3662* (2013.01); *H02J 7/0063* (2013.01)

(58) Field of Classification Search
CPC ............ Y02T 10/7055; Y02T 10/7005; Y02T 10/7044; H02J 2007/005

USPC ........... 318/139; 320/132, 134, 135, 136, 137
See application file for complete search history.

(56) References Cited

U.S. PATENT DOCUMENTS

| 6,424,053 B1 * | 7/2002 | Wakashiro et al. | 290/40 C |
| 6,424,157 B1 * | 7/2002 | Gollomp | G01R 31/006 320/132 |

(Continued)

FOREIGN PATENT DOCUMENTS

| JP | 2001-203935 | 7/2001 |
| JP | 2008-545962 | 12/2008 |

OTHER PUBLICATIONS

International Search Report issued Oct. 23, 2012 in International Application No. PCT/JP2012/067580.

*Primary Examiner* — Rita Leykin
(74) *Attorney, Agent, or Firm* — Wenderoth, Lind & Ponack, L.L.P.

(57) ABSTRACT

A power supply device according to the present invention includes a detector, a memory, and a determinator. The detector detects internal resistance, temperature, and SOC of a battery. The memory stores record data and a predetermined SOC range as storage data. The record data is used for estimating standardized available power at standard SOC temperature corresponding to the detected internal resistance and temperature. If the detected SOC of the battery falls within the range, the determinator estimates standardized available power at the standard SOC and temperature based on the detected internal resistance and temperature, and the record data. When the internal resistance, temperature, and SOC are detected by the detector, if the detected SOC falls within the range, the determinator estimates standardized available power at standard SOC temperature based on the detected internal resistance and temperature, and the record data.

11 Claims, 5 Drawing Sheets

(51) Int. Cl.
*G01R 31/36* (2006.01)
*H02J 7/00* (2006.01)

(56) References Cited

U.S. PATENT DOCUMENTS

| | | | |
|---|---|---|---|
| 6,441,619 B1* | 8/2002 | Araki et al. | 324/427 |
| 7,452,629 B2* | 11/2008 | Komori et al. | 429/176 |
| 7,521,935 B2* | 4/2009 | Uchida | 324/426 |
| 7,593,823 B2* | 9/2009 | Iwane | G01R 31/3679 320/132 |
| 7,969,120 B2* | 6/2011 | Plett | 320/145 |
| 8,581,555 B2* | 11/2013 | Yamamoto et al. | 320/134 |
| 8,649,988 B2* | 2/2014 | Murochi et al. | 702/63 |
| 8,947,023 B2* | 2/2015 | Kawahara | H01M 10/486 318/139 |
| 2002/0054758 A1 | 5/2002 | Mushiage | |
| 2002/0171429 A1* | 11/2002 | Ochiai et al. | 324/426 |
| 2006/0008246 A1 | 1/2006 | Mushiage | |
| 2006/0284618 A1 | 12/2006 | Cho et al. | |

* cited by examiner

POWER SUPPLY DEVICE AND VEHICLE INCLUDING THE SAME

BACKGROUND OF THE INVENTION

1. Field of the Invention

The present invention mainly relates a power supply device that can supply electric power to an electric motor for vehicle traveling, a power supply device that can be charged with electric power generated by natural power sources such as solar batteries or with midnight electric power, and a power supply device suitable as blackout backup power supplies that are suitably prepared for a blackout. The present invention more particularly relates to a power supply device that can estimate standardized available output power, which varies with the time, under the conditions that temperature and SOC are constant, and a vehicle that includes this power supply device.

2. Description of the Related Art

Battery standardized available output power varies with the time. Available battery electric power will decreases with battery deterioration. On the other hand, the available electric power also varies with SOC and temperature. For this reason, if a device estimates standardized available output power of a battery, the device is required to estimate available output power and to detect SOC and temperature at the estimation, which influence the available output power.

If a battery is controlled in charging and discharging operations in the suitable state, available battery output power can be high with suppression of deterioration. For example, in the case where the battery is controlled so that the available battery output power can be reduced in charging and discharging operations with battery deterioration, the life span of the battery can be longer. It is very important for large capacity power supply devices such as vehicle power supply device and natural power storage device to increase their battery lives. The reason is that a number of large capacity batteries are used for high output power, which in turn increase facility cost, and that high output power is required. If a battery of a power supply device is charged/discharged in a certain condition without consideration of available output power of the battery, deteriorated batteries may be sharply further deteriorated when charged/discharged with high electric power, or even in the case where its available output power is adjusted low, the battery life can be long but the battery cannot supply suitable electric power to loads. Accordingly, problems will arise. In order to increase battery life, and to supply loads with electric power as high as possible, it is important to accurately estimate standardized available battery output power, which varies with the time.

A device has been developed which estimates available output capacity of a battery (see Japanese Patent Laid-Open Publication No. JP 2001-203,935 A).

The device disclosed in this Literature detects voltage of the battery to obtain difference voltage values between the detected voltage value and upper and lower limit voltage values of the battery, and an internal resistance value of the battery to estimate the amount of increase/decrease of a current required for a voltage of the battery to agree with the upper and lower limit voltage values based on the internal resistance value and the difference voltage values whereby estimating available output power based on the estimated amount of increase/decrease of a current.

Since the aforementioned device disclosed in the Literature estimates available output power, this device can estimate standardized available output power of the battery based on the available output power. However, available battery output power varies with temperature, SOC, and the like. For this reason, it is necessary to estimate the standardized available battery output power under the conditions that temperature and SOC are specified values. For example, the battery status is estimated under the conditions of standard temperature of 25° C. and standard SOC of 50%. However, in practical use, battery temperature varies and rarely agrees with the standard temperature, and SOC also varies and rarely agrees with the standard SOC. If standardized available output power of a battery is estimated not under the conditions of the standard temperature and the standard SOC but of actual temperature and SOC where the battery is actually charged/discharged, although available output power values can be estimated under similar conditions, the available output power values cannot be accurately compared with each other under the accurately same conditions.

The present invention has been developed for solving the disadvantage. It is an important object of the present invention to provide a power supply device that detects temperature and SOC of a battery to be charged/discharged under the conditions that the temperature and SOC rarely agree with standard temperature and standard SOC, and can estimate standardized available output power under the standard conditions of the battery, and a vehicle that include this power supply device.

In addition, it is another important object of the present invention to provide a power supply device that detects internal resistance and temperature of a battery under the conditions that the temperature and SOC of the battery rarely agree with standard temperature and standard SOC, and can estimate standardized available output power of the battery under the conditions of the standard temperature and the standard SOC whereby accurately detecting the standardized available output power of the battery under the same conditions that the temperature and SOC are standard temperature and standard SOC.

SUMMARY OF THE INVENTION

To achieve the foregoing object, a power supply device according to the present invention is configured as follows.

The power supply device according to the present invention includes a detection circuit 2, a memory circuit 3, and a determination circuit 4. The detection circuit 2 detects internal resistance temperature, and SOC of a battery 1. The memory circuit 3 stores record data and a predetermined SOC range as storage data. The record data is used for estimating standardized available output power of the battery 1 at standard SOC and standard temperature corresponding to the detected internal resistance and temperature of the battery 1. If determining that the detected SOC of the battery 1 falls within the predetermined SOC range, the determination circuit 4 estimates standardized available output power at the standard SOC and the standard temperature based on the detected internal resistance and temperature of the battery 1, which are detected by the detection circuit 2, and the record data, which is stored in the memory circuit 3. In this power supply device, the internal resistance, the temperature, and the SOC of the battery 1 are detected by the detection circuit 2. In comparison between the detected SOC with the predetermined SOC range, which is stored in the memory circuit 3, if determining that the detected SOC falls within the predetermined SOC range, from the detected internal resistance, the temperature and the SOC, the determination circuit 4 estimate the standardized available output power at the standard SOC and the standard temperature based on the detected internal resistance and temperature of the battery 1, and the record data.

According to the thus-constructed power supply device, it is possible to detect temperature and SOC of a battery under the conditions that the temperature and SOC rarely agree with standard temperature and standard SOC, and to accurately estimate standardized available output power under the standard conditions of the battery. The reason is that the thus-constructed power supply device detects the internal resistance, the temperature, and the SOC of the battery, and, under the condition that the detected SOC falls within the predetermined SOC range, the thus-constructed power supply device estimates the standardized available output power under the standard conditions based on the record data, which can be stored as look-up table or function. Thus, this power supply device estimates the standardized available output power under the conditions that the temperature and SOC rarely agree with standard temperature and standard SOC. In order to achieve this, temperature and SOC of the battery 1 are detected under the conditions that the temperature and SOC rarely agree with standard temperature and standard SOC, and to accurately estimate standardized available output power under the standard conditions, i.e., the same conditions.

In the power supply device according to the present invention, the standard SOC can be 50%, the standard temperature can be 25° C., and the predetermined SOC range can extend from 40% to 70%.

In the power supply device according to the present invention, the record data, which is stored in the memory circuit 3, can be stored as look-up table or function.

In the power supply device according to the present invention, output power that can be continuously supplied by the battery for a period of time selected from the range from 5 to 20 seconds at the standard SOC and the standard temperature can be defined as the standardized available output power.

In the power supply device according to the present invention, the determination circuit 4 can detect the degree of deterioration of the battery 1 based on the estimated standardized available output power of the battery 1.

According to the thus-constructed power supply device, although temperature and SOC of the battery are detected under the conditions that the temperature and SOC rarely agree with standard temperature and standard SOC, and it is possible to accurately estimate the degree of deterioration of the battery. In particular, under the condition that the detected SOC falls within the predetermined SOC range, even if the temperature is not standard temperature, it is possible to accurately estimate the degree of deterioration of the battery. Since the degree of deterioration can be estimated even when the battery is not under the standard conditions, it is possible to frequently detect the degree of deterioration of the battery.

In the power supply device according to the present invention, the determination circuit 4 can detect failure of the battery 1 or a device that is connected to the battery 1 based on the estimated standardized available output power of the battery 1.

Since the thus-constructed power supply device can detect failure of the device based on the estimated standardized available output power of the battery, it is possible to detect failure of the device without delay and to improve the safety.

In the power supply device according to the present invention, the memory circuit 3 can include an operating environment storage circuit 6 that stores operating environments of the battery 1 as record data, and the determination circuit 4 can determines whether the operating environments of the battery 1 falls within a guaranteed range based on the record data, which are stored in the operating environment storage circuit 6, and the standardized available output power of the battery 1.

Since the thus-constructed power supply device can determine whether the battery falls within the guaranteed range based on the operating environments and the estimated standardized available output power of the battery, it is possible to know under what environmental conditions the battery that falls outside the guaranteed range is used, and to diagnose the cause of a problem with reliability.

The power supply device according to the present invention can be a vehicle power supply that supplies electric power to an electric motor for vehicle travelling.

The power supply device according to the present invention can be used as a storage power supply device.

A vehicle according to the present invention can include any of the aforementioned power supply devices.

In the vehicle according to the present invention, an electric motor 93 can serve as a load 91 of the power supply device. This vehicle can estimate electrical properties of the battery 1 estimated based on the standardized available output power that is provided from the power supply device, and the vehicle can control electric power supply to the electric motor 93 based on the estimated electrical properties.

According to the vehicle according to the present invention, since electrical properties of the battery can be estimated based on the standardized available output power that is provided from the power supply device so that the vehicle controls electric power supply to the electric motor 93 based on the estimated electrical properties of the battery, it is possible to supply high electric power to the electric motor with suppression of deterioration of the battery.

DETAILED DESCRIPTION OF THE EMBODIMENT(S)

The following description will describe embodiments according to the present invention with reference to the drawings. It should be appreciated, however, that the embodiments described below are illustrations of a power supply device used therein to give a concrete form to technical ideas of the invention, and a power supply device of the invention is not specifically limited to description below. Furthermore, it should be appreciated that the members shown in claims attached hereto are not specifically limited to members in the embodiments. Unless otherwise specified, any dimensions, materials, shapes and relative arrangements of the members described in the embodiments are given as an example and not as a limitation. Additionally, the sizes and the positional relationships of the members in each of drawings are occasionally shown larger exaggeratingly for ease of explanation. Members same as or similar to those of this invention are attached with the same designation and the same reference signs, and their description is omitted. In addition, a plurality of structural elements of the present invention may be configured as a single part that serves the purpose of a plurality of elements, on the other hand, a single structural element may be configured as a plurality of parts that serve the purpose of a single element. Also, the description of some of examples or embodiments may be applied to other examples, embodiments or the like.

A power supply device according to the present invention can be mainly used as a power supply device that can be installed on electric vehicles such as hybrid car and electric car and can supply electric power to an vehicle-driving electric motor for vehicle traveling, a power supply device that can be charged with electric power generated by natural power sources such as solar batteries or with midnight electric power, or a power supply device suitable as blackout backup power supplies that are suitably prepared for a blackout.

Figure 1:
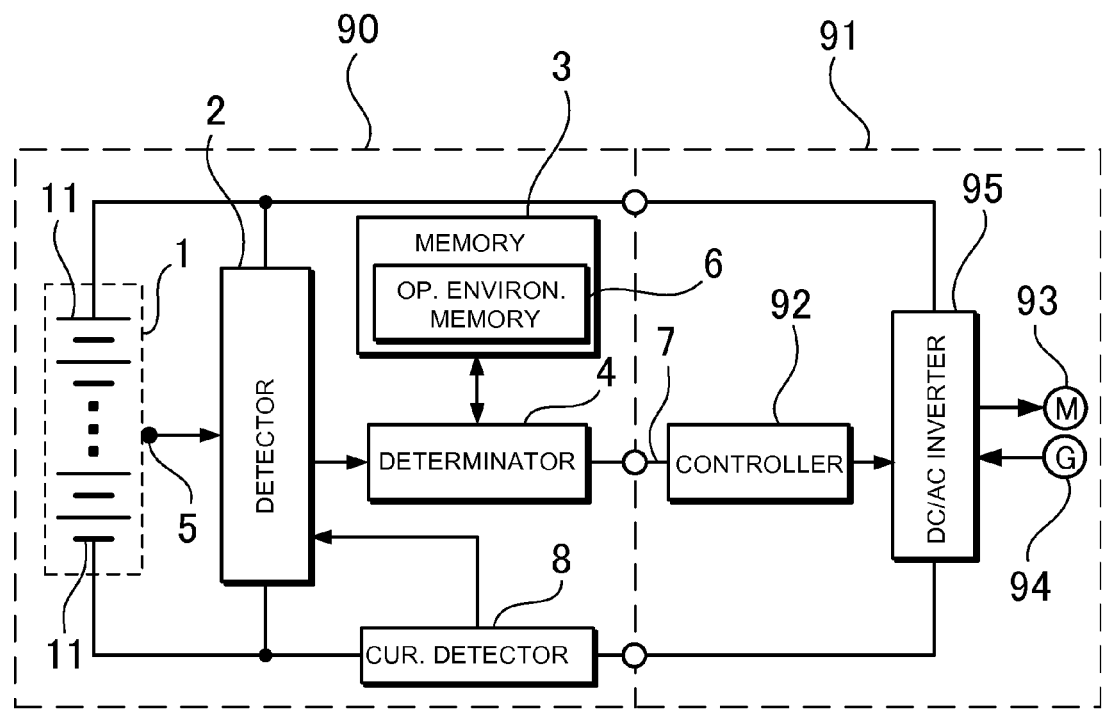
FIG. 1 is a block diagram of a power supply device according to an embodiment of the present invention.

FIG. 1 is a block diagram showing the power supply device 90 according to the present invention. The power supply device illustrated in this block diagram estimates standardized available output power of a battery that is installed on a hybrid car or plug-in hybrid car. The illustrated power supply device 90 can supply electric power to an electric motor 93 through a DC/AC inverter 95 for vehicle traveling, and can be charged with electric power that is generated by a generator 94 that is driven by an internal-combustion engine or regenerative braking. However, the power supply device according to the present invention is not limited to this use.

The power supply device includes a rechargeable battery 1. The battery 1 includes a plurality of cells 11 that are connected to each other in series or both in series and parallel in order to supply high output power. The cell 11 is a lithium-ion rechargeable battery or lithium-polymer battery. Voltage of lithium-ion rechargeable battery or lithium-polymer battery greatly varies with SOC. Accordingly, SOC can be detected based on the voltage. However, the cells 11 of the power supply device according to the present invention are limited to neither lithium ion battery nor lithium-polymer battery. Any rechargeable batteries such as nickel metal hydride battery and nickel-cadmium battery can be used as the cells. In the case where the battery 1 includes the serially-connected cells 11, standardized available output power of the entire battery is estimated. However, the power supply device may estimate standardized available output power of each of the cells, or standardized available output power of each of battery blocks. Each of the battery blocks includes cells. The battery 1 is controlled so that SOC of the battery is adjusted within the range of approximately 50%±20% by discharging operation for supplying electric power to the electric motor for vehicle travelling and charging operation for charging the battery by using the generator.

The power supply device further includes a detection circuit 2, a memory circuit 3, and a determination circuit 4. The detection circuit 2 detects internal resistance, temperature, and SOC of the battery 1. The memory circuit 3 stores record data for estimating standardized available output power of the battery 1 corresponding to the detected internal resistance, temperature and SOC. The determination circuit 4 estimates standardized available output power of the battery 1 based on the record data, which is stored in the memory circuit 3, and data that is detected by the detection circuit 2.

Figure 2:
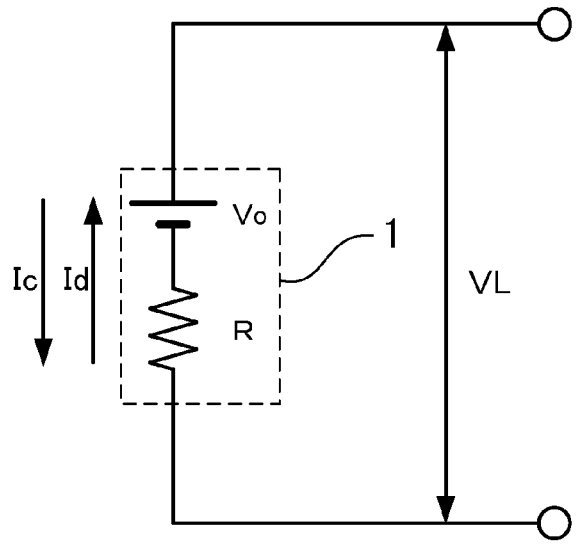
FIG. 2 is a circuit diagram showing an equivalent circuit of a battery having internal resistance.
Figure 3:
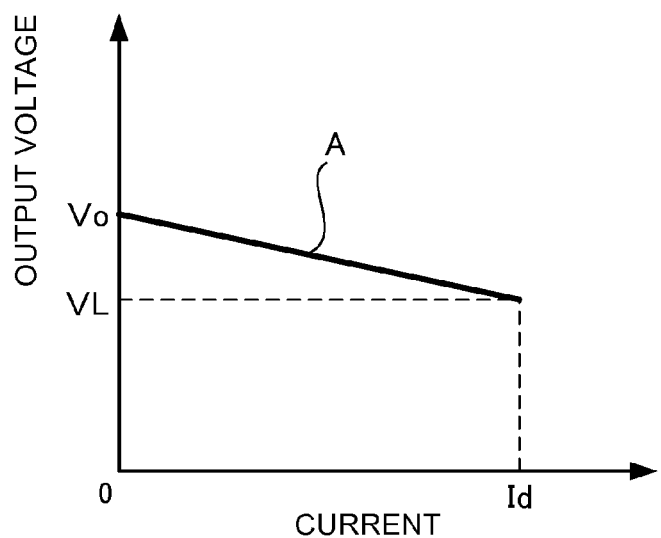
FIG. 3 is a graph showing the property between current and voltage of the battery in discharging operation.
Figure 4:
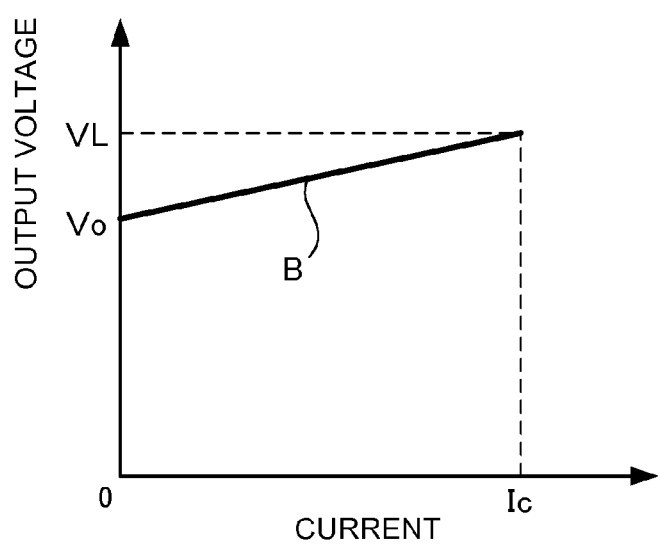
FIG. 4 is a graph showing the property between current and voltage of the battery in charging operation.
Figure 5:
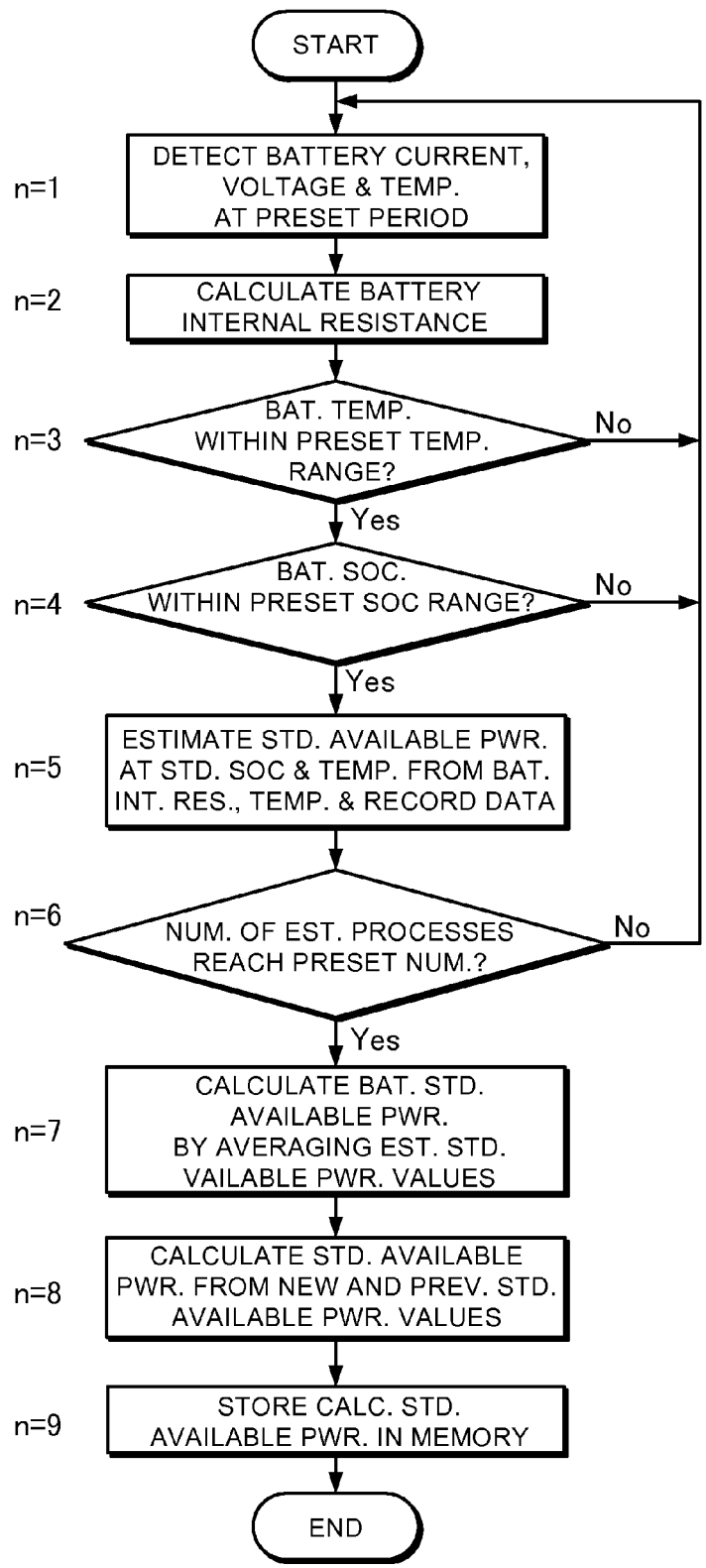
FIG. 5 is a flowchart for estimating standardized available output power of the battery in the power supply device according to the present invention.

The internal resistance, the temperature, and the SOC of the battery 1 are periodically detected at a predetermined cycle by the detection circuit 2. Electric current I is detected by a current detection circuit 8 when the battery 1 is charged/discharged. The detected signal is provided to the detection circuit 2. The internal resistance of the battery 1 can be detected when the battery 1 is charged/discharged. The detection circuit 2 for detecting internal resistance detects discharge internal resistance and charge internal resistance of the battery 1 in charging and discharging operations, and calculates the average of the discharge internal resistance and charge internal resistance as the internal resistance. FIG. 2 is a circuit diagram showing an equivalent circuit of the battery 1 having internal resistance (R). FIGS. 3 and 4 show relationship between electric current I and output voltage VL that are detected when the battery 1 of this equivalent circuit is charged/discharged. The discharge internal resistance (Rd) is calculated based on the gradient of the line A representing the current-voltage property of the battery 1 shown in FIG. 3. The charge internal resistance (Rc) is also calculated based on the gradient of the line B representing the current-voltage property of the battery 1 shown in FIG. 4.

Here, open circuit voltage of the battery 1 is defined Vo, and voltage corresponding to discharging current Id is defined VL. Voltage VL can be represented by the following equation.

$$VL=Vo-Rd \times Id$$

From this equation, discharge internal resistance (Rd) can be obtained by the following equation.

$$Rd=(Vo-VL)/Id$$

Also, open circuit voltage of the battery 1 is defined Vo, and voltage corresponding to charging current Ic is defined VL. Voltage VL can be represented by the following equation.

$$VL=Vo+Rc \times Ic$$

From this equation, charge internal resistance (Rc) can be obtained by the following equation.

$$Rc=(VL-Vo)/Ic$$

The detection circuit 2 calculates the average of discharge internal resistance (Rd) and charge internal resistance (Rc) of the battery 1 as internal resistance (R). In order to detect the current-voltage property of the battery 1, the detection circuit 2 periodically detects electric current and output voltage of the battery 1 in charging and discharging operations at a predetermined sampling cycle. Although the aforementioned detection circuit 2 detects internal resistance (R) from discharge internal resistance (Rd) and charge internal resistance (Rc), the detection circuit may detect internal resistance from the gradient of a line representing the current-voltage property of the battery 1 in charging and discharging operations.

The detection circuit 2 also detects temperature and SOC of the battery 1 when detecting internal resistance. The temperature is detected by a temperature sensor 5, which is thermally connected to the battery 1. Remaining capacity of the battery 1 is detected based on the accumulated value of electric current and voltage of the battery 1 when the battery 1 is charged/discharged. The detection circuit 2 corrects SOC that is calculated as the accumulated value of electric current in charging and discharging operations in accordance with voltage of the battery 1. SOC increases when the battery 1 is charged, while SOC decreases when the battery is discharged. SOC is calculated by adding the accumulated charging current value to the previous SOC and by subtracting the accumulated discharging current value from the previous SOC. In the case where voltage of the battery 1 is high or low, SOC can be accurately detected in accordance with the voltage. For this reason, SOC is corrected in accordance with voltage of the battery 1 when SOC is in a high or low range.

The memory circuit 3 stores record data for estimating standardized available output power at standard SOC and standard temperature corresponding to detected internal resistance and temperature of the battery 1. In addition, the memory circuit 3 also stores a predetermined SOC range, which is previously defined, as storage data. The memory circuit 3 stores standardized available output power at standard SOC and standard temperature corresponding to internal resistance and temperature as look-up table or function. The data for estimating standardized available output power at standard SOC and standard temperature corresponding to internal resistance and temperature of the battery 1 is determined by actual measurement of the same type battery as the battery 1. Table 1 shows exemplary data for estimating standardized available output power at standard SOC and standard temperature corresponding to internal resistance and temperature. This table shows data for estimating standardized available output power at standard SOC of 50% and standard temperature of 25° C. corresponding to internal resistance and temperature. In the case of battery 1 shown in Table 1, under the conditions that internal resistance and temperature of the battery 1 are 310 mΩ and 15° C., respectively, standardized available output power at the standard SOC and the standard temperature is 30 kW. In other words, the battery 1 under the aforementioned conditions has standardized available output power of 30 kW at standard SOC of 50% and standard temperature of 25° C. Although, under the aforementioned conditions for detection of internal resistance at detected temperature and temperature of the battery 1, temperature of the battery is not 25° C. but 15° C., standardized available output power of the battery at 25° C. can be estimated 30 kW. On the other hand, although SOC of the battery 1 under the aforementioned conditions may not agree with 50%, standardized available output power of the battery at 25° C. and SOC of 50% can be estimated 30 kW. Standardized available output power of the battery 1 does not always corresponds to the maximum available output power of the battery 1. The maximum available output power of the battery 1 varies with SOC. If SOC is high, voltage of the battery 1 is also high, and the maximum available output power is also high. On the other hand, if SOC is low, voltage of the battery 1 is also low, and the maximum available output power is also low. Standardized available output power is available output power at standard SOC and standard temperature of the battery 1, for example, output power at standard SOC of 50% and standard temperature of 25° C. the battery 1. Although this table shows data for estimating standardized available output power at standard SOC of 50% and standard temperature of 25° C. corresponding to internal resistance and temperature, the standard SOC and the standard temperature are not limited to these values. For example, standard SOC can be any value selected from the range from 40% to 60%, while standard temperature can be any value selected from the range from 15° C. to 30° C.

TABLE 1

Standardized Available Power at Standard SOC and Temp. [kW]

| | | Battery Temp. [° C.] | | | | | |
|---|---|---|---|---|---|---|---|
| | | 15 | 20 | 25 | 30 | 35 | 40 |
| Internal Resistance [Ω] | 0.25 | 30.00 | 30.00 | 30.00 | 30.00 | 30.00 | 30.00 |
| | 0.28 | 30.00 | 30.00 | 30.00 | 30.00 | 29.21 | 27.66 |
| | 0.31 | 30.00 | 30.00 | 29.31 | 27.93 | 26.84 | 25.32 |
| | 0.34 | 30.00 | 30.00 | 27.26 | 25.85 | 24.47 | 22.98 |
| | 0.37 | 30.00 | 28.15 | 25.20 | 23.78 | 22.10 | 21.38 |
| | 0.40 | 29.46 | 26.31 | 23.14 | 22.01 | 20.91 | 20.15 |
| | 0.43 | 27.83 | 24.46 | 21.73 | 20.84 | 19.71 | 18.93 |
| | 0.46 | 26.20 | 22.62 | 20.63 | 19.67 | 18.52 | 17.70 |
| | 0.49 | 24.57 | 21.40 | 19.54 | 18.50 | 17.32 | 16.47 |
| | 0.52 | 22.94 | 20.50 | 18.45 | 17.33 | 16.13 | 15.25 |
| | 0.55 | 21.85 | 19.60 | 17.36 | 16.16 | 14.94 | 14.02 |
| | 0.58 | 21.02 | 18.70 | 16.27 | 14.99 | 13.74 | 12.79 |
| | 0.61 | 20.20 | 17.80 | 15.17 | 13.82 | 12.55 | 11.56 |
| | 0.64 | 19.37 | 16.90 | 14.08 | 12.65 | 11.35 | 10.34 |
| | 0.67 | 18.55 | 16.00 | 12.99 | 11.48 | 10.16 | 10.00 |
| | 0.70 | 17.72 | 15.10 | 11.90 | 10.31 | 10.00 | 10.00 |
| | 0.73 | 16.90 | 14.20 | 10.81 | 10.00 | 10.00 | 10.00 |
| | 0.76 | 16.07 | 13.30 | 10.00 | 10.00 | 10.00 | 10.00 |
| | 0.79 | 15.25 | 12.40 | 10.00 | 10.00 | 10.00 | 10.00 |
| | 0.82 | 14.42 | 11.50 | 10.00 | 10.00 | 10.00 | 10.00 |
| | 0.85 | 13.59 | 10.60 | 10.00 | 10.00 | 10.00 | 10.00 |

The memory circuit 3 stores output power that can be continuously supplied for 10 seconds at the standard SOC and the standard temperature by the battery in discharging operation as standardized available output power. However, the memory circuit 3 can store output power that can be continuously supplied for a period of time selected from the range from 5 to 20 seconds at the standard SOC and the standard temperature by the battery in discharging operation as standardized available output power.

In addition, the memory circuit 3 stores a predetermined SOC range of the battery 1. The predetermined SOC range of the battery 1 is used for determining whether standardized available output power is estimated in accordance with detected SOC. If the battery 1 is brought close to an overcharged or overdischarged state, standardized available output power cannot be accurately estimated based on internal resistance and temperature. For this reason, the range of SOC is predetermined which is used for determining whether standardized available output power is estimated based on detected internal resistance and temperature. For example, this predetermined SOC range extends from 40% to 70%. If the predetermined SOC range is wide, there is a high probability that the standardized available output power of the battery 1 is estimated but the accuracy may be low. Contrary to this, if the predetermined SOC range is narrow, the accuracy can be high but the probability of estimation may be low. From this viewpoint, the above predetermined SOC range is defined in consideration of the accuracy and probability of standardized available output power estimation. In particular, the vehicle power supply device controls charging and discharging operations so that SOC of the battery 1 is adjusted within the range of 50%±20%. Since this ranged is defined as the predetermined SOC range, it is possible to estimate standardized available output power of the battery 1 with high probability and high accuracy.

The determination circuit 4 determines whether SOC of the battery 1 that is detected by the detection circuit 2 falls within the predetermined SOC range, which is stored in the memory circuit 3. When it is determined that SOC of the battery 1 falls within the predetermined SOC range, in other words, only when the detected SOC of the battery 1 falls within the predetermined SOC range, the determination circuit 4 estimates standardized available output power of the battery 1 at the standard SOC and the standard temperature based on internal resistance and temperature of the battery 1 that are detected by the detection circuit 2, and the record data, which is stored in the memory circuit 3. The determination circuit 4 can provide the latest standardized available output power as the estimated standardized available output power. Alternatively, the determination circuit 4 can provide the average of plurality of standardized available output power values that are periodically detected at a predetermined cycle as the estimated standardized available output power.

The power supply device stores the standardized available output power that is estimated by the determination circuit 4 in the memory circuit 3. The latest standardized available output power can be defined as standardized available output power that is newly estimated by the determination circuit 4. Alternatively, standardized available output power can be calculated based on previous standardized available output power feedback (for example, the next previous standardized available output power, which is defined as the latest standardized available output power in the next previous estimation process). In this case, it is possible to more accurately estimate standardized available output power. This determination circuit 4 rewrites the calculated standardized available output power into the memory circuit 3 as the latest standardized available output power.

(Latest standardized available output power)=(Weight 1)×(Previous standardized available output power)+(Weight 2)×(Newly-estimated standardized available output power)

where (Weight 1)+(Weight 2)=1

In the case where weight 2 is large, the weight of estimated available output power can be large, while in the case where weight 1 is large, the weight of previous available output power can be large. It is preferable that the weight 2 is a value selected from the range from 0.1 to 0.5. In addition, the ratio between the weights can also be changed based on internal resistance of the detected battery 1. In this case, as internal resistance of the battery 1 increases, weight 2 is adjusted larger so that the weight of newly-estimated available output power is adjusted larger.

The aforementioned power supply device estimates standardized available output power of the battery 1 as shown in the following flow.

(Step n=1)

The detection circuit 2 detects electric current, voltage, and temperature of the battery 1. In this step, the electric current, voltage, and temperature are periodically detected multiple times at a predetermined cycle. For example, the electric current, voltage, and temperature are periodically detected at a sampling period of 100 msec for 10 sec, i.e., 100 times, as detected data for calculating internal resistance.

In addition, SOC of the battery 1 is detected based on the accumulated value of electric current and voltage of the battery 1 when the battery 1 is charged/discharged.

(Step n=2)

The detection circuit 2 calculates internal resistance of the battery 1 based on the detected data. The detection circuit 2 detects discharge internal resistance and charge internal resistance of the battery 1 in charging/discharging operations, and calculates the average of the discharge internal resistance and charge internal resistance as the internal resistance.

(Step n=3)

It is determined whether the detected temperature falls within a predetermined temperature range. The predetermined temperature range can extend from 15° to 40° C., for example. If the detected temperature falls within the predetermined temperature range, the procedure goes to the next step. If the detected temperature falls outside the predetermined temperature range, the procedure goes back to Step 1.

(Step n=4)

It is determined whether SOC that is detected by the detection circuit 2 falls within a predetermined SOC range. The predetermined SOC range can extend from 40% to 70%, for example. If the detected SOC falls within the predetermined SOC range, the procedure goes to the next step. If the detected SOC falls outside the predetermined SOC range, the procedure goes back to Step 1.

(Step n=5)

If the detected SOC falls within the predetermined SOC range, the determination circuit 4 estimates standardized available output power at standard SOC and standard temperature based on the detected internal resistance and temperature of the battery 1, and record data, which is stored in the memory circuit 3.

(Step n=6)

It is determined whether the number of estimated standardized available output power values that are detected by the determination circuit 4 becomes a predetermined sampling number. Until the number of estimated standardized available output power values that are detected by the determination circuit 4 becomes the predetermined sampling number, the loop from Steps 1 to 6 executes.

(Step n=7)

If the number of estimated standardized available output power values that are detected by the determination circuit 4 becomes the predetermined sampling number, standardized available output power of the battery 1 is estimated by calculating the average of the aforementioned estimated standardized available output power values.

(Step n=8)

Standardized available output power is calculated based on the standardized available output power that is estimated in the previous step and the previous standardized available output power that is previously stored by using the following equation.

(Latest standardized available output power)=(Weight 1)×(Previous standardized available output power)+(Weight 2)×(Newly-estimated standardized available output power)

where (Weight 1)+(Weight 2)=1

(Step n=9)

The calculated standardized available output power is rewritten into the memory circuit 3 as the latest standardized available output power.

The power supply device estimates standardized available output power of the battery 1 according to the aforementioned flow. However the power supply device may omit Steps of 6 and 7, and Steps of 8 and 9 in the aforementioned flow. In the case where Steps of 6 and 7 are omitted, standardized available output power is calculated based on standardized available output power that is estimated by the determination circuit, and previous standardized available output power that is previously stored. In the case where Steps of 8 and 9 are omitted, standardized available output power that is obtained by calculating the average of the standardized available output power values detected in the predetermined sampling number of processes is estimated as standardized available output power of the battery without consideration of previous standardized available output power.

Standardized available output power of the battery 1 will vary with deterioration of the battery. From this viewpoint, it is possible to estimate the degree of deterioration of the battery 1 based on the estimated standardized available output power. In order to achieve this estimation, the power supply device stores the relationship between standardized available output power and degree of deterioration of the battery 1 as deterioration data in the memory circuit 3. The determination circuit 4 estimates the degree of deterioration of the battery 1 based on standardized available output power that is estimated based on the deterioration data of the battery 1. This power supply device detects internal resistance, temperature, and SOC of the battery 1, and can estimate the degree of deterioration of the battery 1 in addition to standardized available output power.

Also, standardized available output power of the battery 1 will vary with failure of a device that is connected to the power supply device. For example, in the case of failure of the device, if an excessive amount of electric current flows from the power supply device, the electrical properties of the battery 1 will sharply deteriorate, which in turn causes variation of standardized available output power. From this viewpoint, the determination circuit 4 of the power supply device can also detect failure of the device, which is connected to the power supply device, based on the variation of standardized available output power. The determination circuit 4 of this power supply device stores standard data concerning normal variation of standardized available output power. When standardized available output power varies, if the variation of standardized available output power falls outside the normal variation, the determination circuit can detect failure of the device, which is connected to the power supply device.

Also, standardized available output power of the battery 1 will vary with operating environments. For example, if the battery 1 is used or stored in a high temperature environment, or is charged/discharged with a large amount of electric current, the electrical properties of the battery will deteriorate, which in turn causes variation of standardized available output power. Accordingly, if the power supply device is used in hostile environments, standardized available output power of the battery 1 may sharply deviate and fall outside a guaranteed range of the battery. If standardized available output power of the battery of the power supply device falls outside the guaranteed range of the battery, it is important to determine for the power supply device whether the operating environment or the power supply device itself causes the deviation. In order to achieve this determination, the memory circuit 3 of the power supply device includes an operating environment storage circuit 6 that stores operating environments of the battery 1 as record data. The determination circuit 4 determines whether the operating environments of the battery 1 fall within the guaranteed range based on the standardized available output power of the battery 1 in consideration of the record data, which represents the operating environments that are stored in the operating environment memory circuit 6. Even if standardized available output power deviates from the guaranteed range, in the case where the power supply device is used in a very hostile environment that is not guaranteed to use the battery, it is determined that the environment falls outside the quality guaranteed range. Based on record data of the operating environments, even in the case where the power supply device is used in normal environments, if standardized available output power deviates from the guaranteed range, it is determined that the power supply device itself causes the deviation, and that the power supply device is used in the quality guaranteed range.

The power supply device sends standardized available output power that is estimated by the determination circuit 4 to the load side such as vehicle or the like through a communication circuit 7. The control circuit 92 of the load 91 such as vehicle or the like estimates the electrical properties of the battery 1 based on the standardized available output power of the battery 1, which is sent from the power supply device 90. The control circuit 92 stores data for estimating the electrical properties of the battery 1 based on standardized available output power as look-up table or function. The control circuit 92 adjusts charging current, discharging current, SOC, charging voltage, discharge voltage, and the like of the battery 1 in suitable conditions for estimated electrical properties of the battery 1 so that the maximum available output power of the battery 1 is adjusted as high as possible, and deterioration is suppressed as small as possible to increase the life of the battery.

The aforementioned power supply device can be used as a power source for vehicles. The power supply device can be installed on electric vehicles such as hybrid cars that are driven by both an internal-combustion engine and an electric motor, and electric cars that are driven only by an electric motor. The power supply device can be used as a power supply device for these types of vehicles.

(Hybrid Car Power Supply Device)

Figure 6:
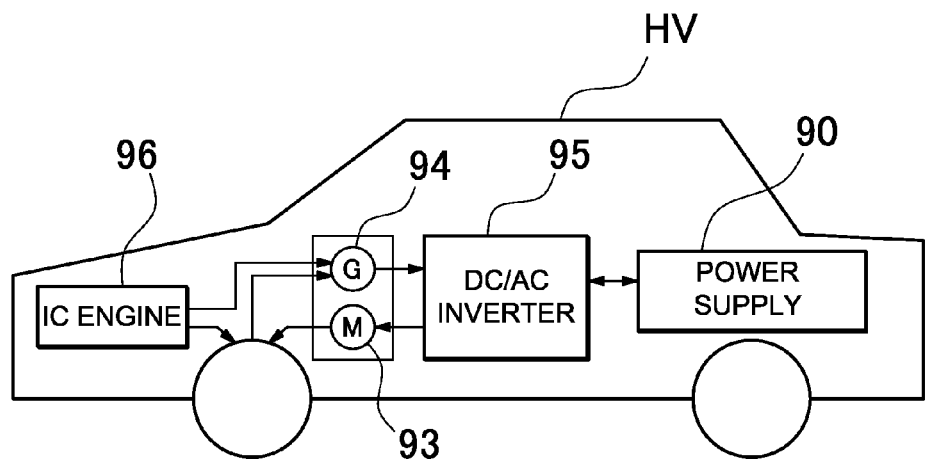
FIG. 6 is a block diagram showing an exemplary hybrid car that is driven by an internal-combustion engine and an electric motor, and includes the power supply device.

FIG. 6 is a block diagram showing an exemplary hybrid car that is driven both by an internal-combustion engine and an electric motor, and includes the power supply device. The illustrated vehicle HV to be equipped with a power supply device 90 includes an electric motor 93 and an internal-combustion engine 96 that drive the vehicle HV, the power supply device 90 that supplies electric power to the electric motor 93, and an electric generator 94 that charges batteries of the power supply device 90. The power supply device 90 is connected to the electric motor 93 and the electric generator 94 via a DC/AC inverter 95. The vehicle HV is driven both by the electric motor 93 and the internal-combustion engine 96 with the batteries of the power supply device 90 being charged/discharged. The electric motor 93 is energized and drives the vehicle in a poor engine efficiency range, e.g., in acceleration or in a low speed range. The electric motor 93 is energized by electric power that is supplied from the power supply device 90. The electric generator 94 is driven by the engine 96 or by regenerative braking during vehicle braking so that the batteries of the power supply device 90 are charged.

(Electric Vehicle Power Supply Device)

Figure 7:
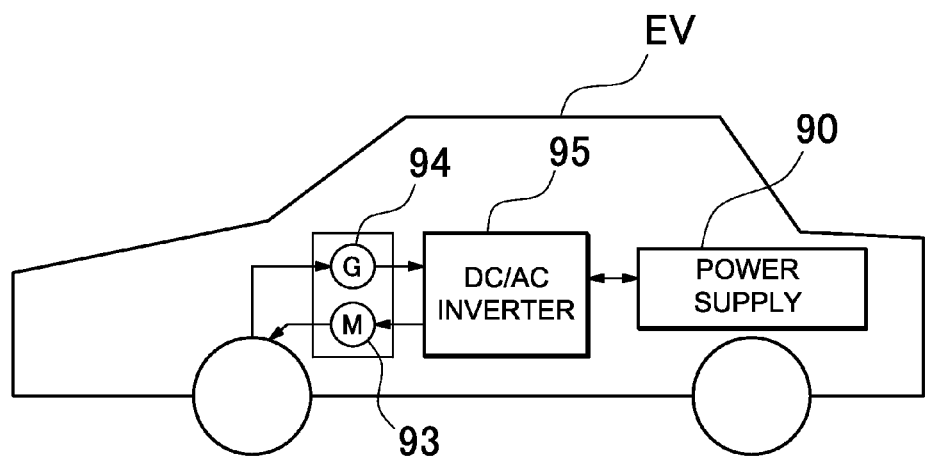
FIG. 7 is a block diagram showing an exemplary electric car that is driven only by an electric motor, and includes the power supply device.

FIG. 7 shows an exemplary electric vehicle that is driven only by an electric motor, and includes the power supply device. The illustrated vehicle EV equipped with the power supply device 90 includes the electric motor 93, which drives the vehicle EV, the power supply device 90, which supplies electric power to the electric motor 93, and the electric generator 94, which charges batteries of the power supply device 90. The power supply device 90 is connected to the electric motor 93 and the electric generator 94 via a DC/AC inverter 95. The electric motor 93 is energized by electric power that is supplied from the power supply device 90. The electric generator 94 can be driven by vehicle EV regenerative braking so that the batteries of the power supply device 90 are charged.

(Power Storage Type Power Supply Device)

A power supply device according to the present invention is not limited to be used as the power supply for the electric motor for vehicle travelling. A power supply device according to the present invention can be used as a power storage type power supply device including batteries that can be charged with electric power generated by solar battery, aerogenerator and the like, and store the electric power. Alternatively, a power supply device according to the present invention can be used as a power storage type power supply device including batteries that can be charged with midnight electric power, and store the electric power. A power supply device to be charged with midnight electric power can be charged with midnight electric power as surplus electric power of power plants, and can supply the electric power in daytime where power demand is high so that the peak power demand for power plants can be reduced. In addition, the power supply device can be constructed to be charged both with electric power generated by solar batteries, and the midnight electric power. This power supply device can efficiently store electric power by effectively using electric power generated by solar batteries, and the midnight electric power in consideration of weather and required power consumption.

Figure 8:
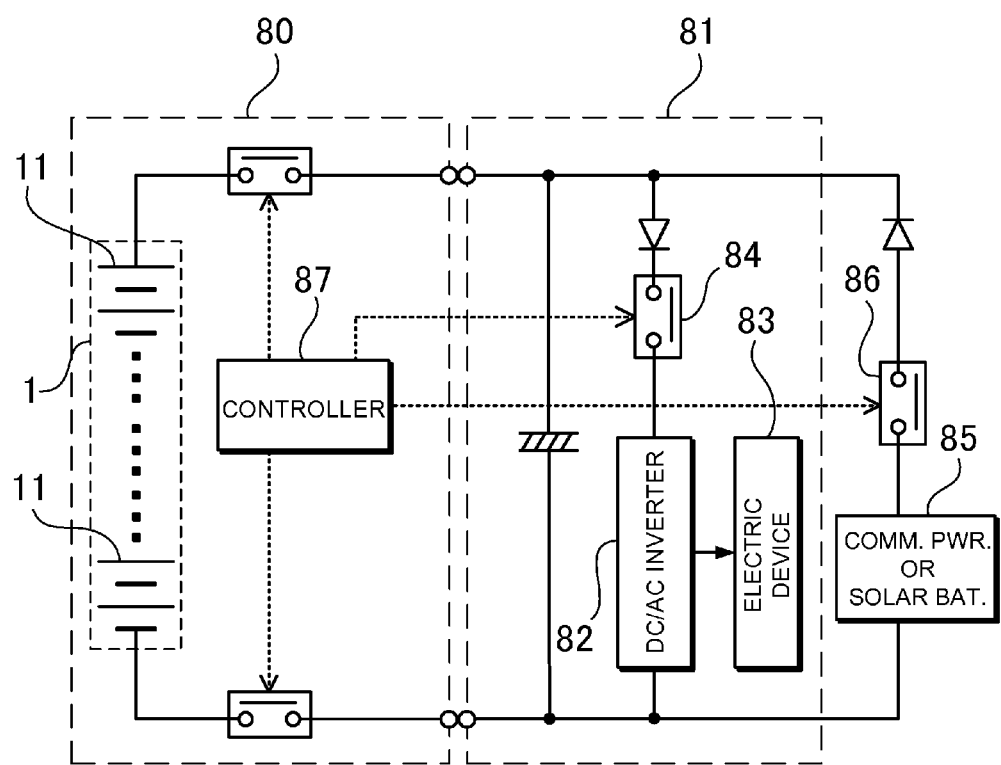
FIG. 8 is a block diagram a power storage type power supply device to which the present invention is applied.

In an electric power storage device shown in FIG. 8, batteries of a power supply device 80 can be charged by a charging power supply 85 such as midnight electric power of commercial power, solar batteries, and the like. The batteries of the power supply device 80 can be discharged and supply electric power to a DC/AC inverter 82 of a load 81. To achieve this, the illustrated electric power storage device has charging and discharging modes. The charging power supply 85 is connected to the power supply device 80 through a charging switch 86. The DC/AC inverter 82 is connected to the power supply device 80 through a discharging switch 84. The discharging switch 84 and the charging operation switch 86 are turned ON/OFF by a control circuit 87 of the power supply device 80. In the charging mode, the control circuit 87 turns the charging operation switch 86 ON, and turns the discharging switch 84 OFF so that the batteries of the power supply device 80 can be charged with electric power supplied from the charging power supply 85. According to the power supply device 80, if charging operation is completed so that the batteries are fully charged, or if the capacity of the batteries reaches a predetermined value, the control circuit 87 turns the charging switch 86 OFF so that charging operation stops. In the discharging mode, the control circuit 87 turns the discharging operation switch 84 ON, and turns the charging switch 86 OFF so that electric power can be supplied to the load 81 from the power supply device 80. In the load 81 to be supplied with electric power from the power supply device 80, the electric power will be supplied to an electric device 83 through the DC/AC inverter 82 from the power supply device 80. According to the power supply device 80, if the remaining capacity of the batteries decreases to a predetermined value, the control circuit 87 turns the discharging switch 84 OFF so that discharging operation stops. In addition, if necessary, the charging operation switch 86 may be turned ON, while the discharging switch 84 may be turned ON in the electric power storage device so that the load 81 can be supplied with electric power while the power supply device 80 can be charged.

A power supply device according to the present invention can be suitably applied to power supply devices of plug-in hybrid vehicles and hybrid electric vehicles that can switch between the EV drive mode and the HEV drive mode, electric vehicles, and the like. Also, a power supply device according to the present invention can be suitably used as backup power supply devices that can be installed on a rack of a computer server, backup power supply devices for wireless communication base stations, electric power storages for home use or plant use, electric power storage devices such as electric power storages for street lights connected to solar cells, backup power supplies for signal lights, and the like.

What is claimed is:

1. A power supply device comprising:
   a detection circuit that detects internal resistance, temperature, and SOC of a battery;
   a memory circuit that stores record data and a predetermined SOC range as storage data, the record data being estimated standardized available output power at standard SOC and standard temperature at the detected internal resistance and temperature of the battery; and
   a determination circuit that, when the internal resistance, the temperature, and the SOC of the battery are detected by said detection circuit, in a comparison between the detected SOC with the predetermined SOC range, which is stored in the memory circuit, if it is determined that the detected SOC of the battery falls within the predetermined SOC range, estimates standardized available output power of the battery at the standard SOC and the standard temperature at the detected internal resistance and temperature of the battery, which are detected by the detection circuit, and the record data, which is stored in the memory circuit.

2. The power supply device according to claim 1, wherein said standard SOC is 50%, said standard temperature is 25° C., and said predetermined SOC range extends the range from 40% to 70%.

3. The power supply device according to claim 1, wherein said record data, which is stored in said memory circuit, is stored as look-up table or function.

4. The power supply device according to claim 1, wherein said standardized available output power can be continuously supplied by the battery for a period of time selected from the range from 5 to 20 seconds at the standard SOC and the standard temperature.

5. The power supply device according to claim 1, wherein said determination circuit detects the degree of deterioration of the battery based on the estimated standardized available output power of the battery.

6. The power supply device according to claim 1, wherein said determination circuit detects failure of the battery or a device that is connected to the battery based on the estimated standardized available output power of the battery.

7. The power supply device according to claim 1, wherein said memory circuit includes an operating environment storage circuit that stores operating environments of the battery as record data, wherein said determination circuit determines whether the operating environments of the battery falls within a guaranteed range based on the operating environments, which are stored in the operating environment storage circuit as the record data, and the standardized available output power of the battery.

8. The power supply device according to claim 1, wherein said power supply device is a vehicle power supply that supplies electric power to an electric motor for vehicle travelling.

9. The power supply device according to claim 1, wherein said power supply device is a power storage type power supply device.

10. A vehicle comprising the power supply device according to claim 1.

11. The vehicle according to claim 10 further comprising an electric motor serves as a load of said power supply device, wherein said vehicle estimates electrical properties of the battery based on the standardized available output power that is provided from said power supply device, wherein said vehicle controls electric power supply to the electric motor based on the estimated electrical properties of the battery.

* * * * *